(12) United States Patent
Langenberg et al.

(10) Patent No.: US 10,658,748 B2
(45) Date of Patent: May 19, 2020

(54) SHIELD HOUSING FOR HF APPLICATIONS

(71) Applicant: Kathrein Werke KG, Rosenheim (DE)

(72) Inventors: Jörg Langenberg, Rosenheim (DE); Torsten Richter, Rosenheim (DE); Josef Mayer, Rosenheim (DE)

(73) Assignee: KATHREIN SE (DE)

( * ) Notice: Subject to any disclaimer, the term of this patent is extended or adjusted under 35 U.S.C. 154(b) by 260 days.

(21) Appl. No.: 15/595,544

(22) Filed: May 15, 2017

(65) Prior Publication Data

US 2017/0331184 A1 Nov. 16, 2017

(30) Foreign Application Priority Data

May 13, 2016 (DE) .................. 10 2016 108 867

(51) Int. Cl.
| | | |
|---|---|---|
| *H01Q 1/52* | (2006.01) | |
| *H01Q 1/24* | (2006.01) | |
| *H05K 9/00* | (2006.01) | |
| *H01Q 1/22* | (2006.01) | |
| *H01Q 1/48* | (2006.01) | |

(52) U.S. Cl.
CPC .............. *H01Q 1/526* (2013.01); *H01Q 1/22* (2013.01); *H01Q 1/246* (2013.01); *H01Q 1/48* (2013.01); *H05K 9/006* (2013.01); *H05K 9/0007* (2013.01)

(58) Field of Classification Search
None
See application file for complete search history.

(56) References Cited

U.S. PATENT DOCUMENTS

| | | | |
|---|---|---|---|
| 5,633,786 A | 5/1997 | Matuszewski et al. | |
| 7,362,285 B2 * | 4/2008 | Webb ...................... | H01Q 1/38 235/451 |
| 2005/0219140 A1 * | 10/2005 | Browne ................ | H01Q 9/285 343/814 |
| 2008/0252552 A1 * | 10/2008 | Goebel ................. | H01Q 1/246 343/872 |
| 2012/0068906 A1 | 3/2012 | Asher et al. | |
| 2013/0070819 A1 | 3/2013 | Zhao et al. | |

(Continued)

FOREIGN PATENT DOCUMENTS

| | | |
|---|---|---|
| DE | 1938332 B2 | 2/1976 |
| DE | 9318909 U1 | 4/1995 |

(Continued)

OTHER PUBLICATIONS

DE102012213520 English Translation.

(Continued)

*Primary Examiner* — Trinh V Dinh
(74) *Attorney, Agent, or Firm* — Fish IP Law, LLP

(57) ABSTRACT

What is provided is a shield housing for shielding interconnect structures and/or components disposed on a circuit board, wherein at least two antenna radiators can be disposed on the shield housing, and wherein the shield housing is configured in such a manner that it can cover the interconnect structures and/or components disposed on the circuit board, at least in part, can be connected with a ground surface of the circuit board, and has a region between the antenna radiators, which region is configured in such a manner that it provides electrical decoupling of the feed of the antenna radiators from one another.

9 Claims, 3 Drawing Sheets

(56) References Cited

U.S. PATENT DOCUMENTS

| | | |
|---|---|---|
| 2014/0016293 A1 | 1/2014 | Song |
| 2014/0104114 A1 | 4/2014 | Rogers et al. |
| 2014/0268598 A1 | 9/2014 | Lee et al. |
| 2015/0200445 A1* | 7/2015 | Murphy ................ H01Q 1/243 343/702 |

FOREIGN PATENT DOCUMENTS

| | | |
|---|---|---|
| DE | 69831700 T2 | 7/2006 |
| DE | 102012213520 A1 | 2/2014 |
| EP | 1133064 A1 | 9/2001 |
| GB | 2345209 A | 6/2000 |

OTHER PUBLICATIONS

DE9318909 English Translation.
DE69831700 English Translation.
DE1938332B2 English Translation.

* cited by examiner

SHIELD HOUSING FOR HF APPLICATIONS

This application claims priority to Germany Patent Application No. 10 2016 108 867.6, filed May 13, 2017.

FIELD OF THE INVENTION

The invention relates to a shield housing for HF applications, as well as to a connection element, to an antenna radiator, and to a corresponding system.

BACKGROUND OF THE INVENTION

For base station antennas in the mobile communications sector, phase-fixed interconnection of two or more radiator components to form radiator blocks has become common in certain embodiments. The effort and expense for the feed network can be reduced by means of combining radiators to form fixed blocks, thereby reducing costs, but also reducing the need for space, the production effort, and the mass of the antenna as a whole. The most frequent case is interconnection of two radiators to form a unit. While interconnection using suitable combiners and coaxial cables in the form of strip lines in air is fundamentally usual and continues to be usual in the case of frequency ranges below 1.0 GHz, in recent years implementation with circuit boards has proven itself as a good approach for broadband and cost-advantageous solutions, above all in the frequency range of 1.0 GHz to 4.0 GHz and beyond.

In order to supply one or more radiators with the desired electrical signals and to be able to implement suitable input impedances at defined interfaces by way of transformation structures, circuit boards using micro-strip technology have proven to be a good solution approach. Coaxial cables or other signal lines, which are an integral part of the supply network of the antenna, can be affixed at these interfaces.

The usual implementation of radiator blocks using strip lines (for example micro-strip) is that the interconnect structure of the circuit board is directed more or less in the direction of the main beam direction of the antenna, while the ground surface of the circuit board faces the reflector of the antenna, but is generally capacitively separated from it by means of an electrically insulating varnish, a film or another thin insulator. As a result of this open structure of the circuit board on the radiator side of the antenna, not only the desired properties but also possibilities for undesirable interactions of the circuit board with the radiators as well as the other surroundings, such as the reflector or other electrically conductive structures occur. These interactions can have negative effects, since certain antenna parameters are influenced in disruptive manner and compensation is hardly possible, or only possible within certain limits, with increased effort.

In order to avoid undesirable interactions of open circuit board structures or, in general, of open conductor structures, usually shields or shield housings are used in electrical technology. Shielding covers or shield housings in different embodiments are used against high-frequency incoming or outgoing radiation on or of circuit boards or open conductor structures. Undesirable influences between different components in a system, for example an antenna, can be avoided in this way.

The function of a shield housing is fulfilled when the greatest possible shield attenuation is achieved in the working ranges or frequency ranges of the circuit boards or of the (antenna) system to be shielded. Shield housings are widespread in electrical technology, in the most varied embodiments, and different approaches can also be found in antenna technology and filter technology.

It is the task of this invention to provide shielding for individual radiators or for a radiator block having at least two dipoles, using an open conductor structure, in which disruptive interactions between the conductor structure and the radiators as well as the rest of the antenna are avoided.

This task is accomplished, according to the invention, by means of the characteristics of the independent claims. Advantageous embodiments are the object of the dependent claims.

SUMMARY OF THE INVENTION

What is proposed, according to the invention, is a shield housing for shielding interconnect structures and/or components disposed on a circuit board, wherein at least two antenna radiators can be disposed on the shield housing, and wherein the shield housing is configured in such a manner that it can cover the interconnect structures and/or components disposed on the circuit board, at least in part, can be connected with a ground surface of the circuit board, and has a region between the antenna radiators, which region is configured in such a manner that it provides electrical decoupling of the feed of the antenna radiators from one another.

The top of the shield housing is referred to as a lid or a shield lid. The placement of the antenna radiators on the top of the shield housing, in other words the lid, will be described later, making reference to the figures.

In an advantageous embodiment, the shield housing is configured in such a manner that it can completely cover the interconnect structures and/or components disposed on the circuit board.

In an advantageous embodiment, a ground is drawn to the ground surface of the circuit board by means of through-contacting on the top of the circuit board, and the shield housing and/or one or more of the at least one lid are directly contacted with the ground at the top.

Optimized shielding of HF components against undesirable influences or interactions is achieved by means of covering the circuit board with the shield housing and, at the same, decoupling the antenna radiators.

Furthermore, it is provided that the region between the antenna radiators is a region in the center of the shield housing, which region is configured as an opening having folded areas around the opening in the shield housing.

Providing a one-piece shielding housing having folded areas situated in the center allows simple and cost-advantageous production of the housing from one piece.

In an advantageous embodiment, connectors or pins, which are disposed at a predetermined pin distance from one another, are disposed on the folded areas to contact the circuit board.

Adherence to a predetermined pin distance, which can be calculated as a function of the frequency ranges used, guarantees optimal shielding.

Furthermore, it is provided, according to the invention, that the region between the feed points of the antenna radiators is configured as a partition wall connected with the shield housing.

In an advantageous embodiment, the partition wall is electrically connected or coupled with the shield housing, capacitively or galvanically.

Providing a one-piece shielding housing having a partition wall that is electrically coupled with it, capacitively or galvanically, situated in the center, is an easy to produce and cost-advantageous alternative to providing folded areas.

Furthermore, it is provided, according to the invention, that the shield housing consists of two parts, which can be disposed on the circuit board at a predetermined shield housing distance from one another.

Providing a two-part shield housing is an alternative to a shield housing configured in one piece and demonstrates the same advantages.

Furthermore, it is provided, according to the invention, that the shield housing has connectors or pins on its outer edge for contacting the ground surface of the circuit board, which connectors or pins are disposed at a predetermined pin distance from one another.

By providing pins at a predetermined distance, reliable attachment of the shield housing on the circuit board, optimized for shielding, can be provided.

In an advantageous embodiment, the predetermined pin distance amounts to 5 mm≤distance≤15 mm. This pin distance is advantageous for use in the frequency range from 0.5 GHz to 4.0 GHz, in order to achieve optimal shielding.

Furthermore, it is provided, according to the invention, that the shield housing has recesses for placement of the two antenna radiators, wherein the shield housing, in the region in which the inner conductor of each antenna radiator is connected with the circuit board, has a structure deep-drawn from it, having at least one connector or pin disposed on it for contacting the ground surface of the circuit board.

By providing a deep-drawn structure on the shield housing, direct connection of the antenna radiator with the ground surface can take place, without additional holes being required on the top of the shield housing.

Furthermore, within the scope of the present invention, a connection element for connecting an antenna radiator disposed on the shield housing described above with the ground surface of the circuit board is provided, wherein the shield housing has recesses for placement of the antenna radiator, and wherein the connection element is configured in such a manner that it can be disposed in the region in which the inner conductor of each antenna radiator is connected with the circuit board.

Furthermore, it is provided, according to the invention, that the connection element is coupled with the shield housing capacitively or galvanically, and has structures by means of which the shortest possible connection between the line system of the antenna radiator and the ground surface of the circuit board can be provided.

By providing a connection element that is coupled with the shield housing and the circuit board, capacitively or galvanically, direct connection of the antenna radiator with the ground surface of the circuit board can take place without additional holes being required on the top of the shield housing for attaching or soldering the contacts, and without either the shield housing or the antenna radiator having to have a special structure.

Furthermore, within the scope of the present invention, an antenna radiator is provided for placement of a shield housing as described above, wherein the antenna radiator has an extension of its line system and at least one connector or pin, in order to be contacted with the ground surface of the circuit board.

By providing a suitable structure on the antenna radiator, direct connection of the antenna radiator with the ground surface can take place without further holes being required on the top of the shield housing.

Furthermore, within the scope of the present invention, a system is provided, comprising a shield housing as described above and/or a connection element as described above and/or an antenna radiator as described above, which housing or element or radiator is/are disposed on a circuit board, wherein the circuit board has recesses for passing through all the pins and structures to be contacted with the circuit board. Furthermore, the system comprises an adapter plate, which is disposed on the side of the circuit board that lies opposite the shield housing, and a reflector disposed on the adapter plate, wherein the adapter plate is configured in such a manner that it bulges outward at locations at which a connector or pin is passed through the circuit board to the side of the adapter plate, above the connector or pin, and the reflector has an opening at this location.

Furthermore, within the scope of the present invention, a system comprising a shield housing as described above and/or a connection element as described above and/or an antenna radiator as described above is/are provided, which housing or element or radiator is disposed on a circuit board, wherein the circuit board has recesses for passing through all the pins and structures to be contacted with the circuit board. Furthermore, the system comprises an adapter plate that is disposed on the side of the circuit board that lies opposite the shield housing, and a reflector disposed on the adapter plate, wherein the adapter plate is configured in such a manner that it has a minimum thickness that corresponds to a length of the longest connectors or pins that are passed through the circuit board to the side of the adapter plate, and has an opening at locations where a connector or pin is passed through the circuit board to the side of the adapter plate.

By providing the adapter plate in the aforementioned embodiments, disruptive influences on the reflector, caused by the pins that penetrate through the circuit board, can be avoided.

Further characteristics and advantages of the invention are evident from the following description of exemplary embodiments of the invention, using the figures of the drawing, which shows details according to the invention, and from the claims. The individual characteristics can be implemented individually, on their own, or with multiple characteristics in any desired combination, in a variant of the invention.

Preferred embodiments of the invention will be explained in greater detail below, using the attached drawing.

DETAILED DESCRIPTION

In the following figure descriptions, the same elements or functions are provided with the same reference symbols.

The placement of the antenna radiator on the shield housing and the circuit board depends on the application. In the mobile communications sector, implementation of combined radiators with two orthogonally disposed polarizations is usual. The shield housing 1 according to the invention was developed in order to be able to electrically decouple the feed of the two polarizations of the radiators from one another. This shield housing 1 can achieve the same effect in different embodiments.

Figure 1:
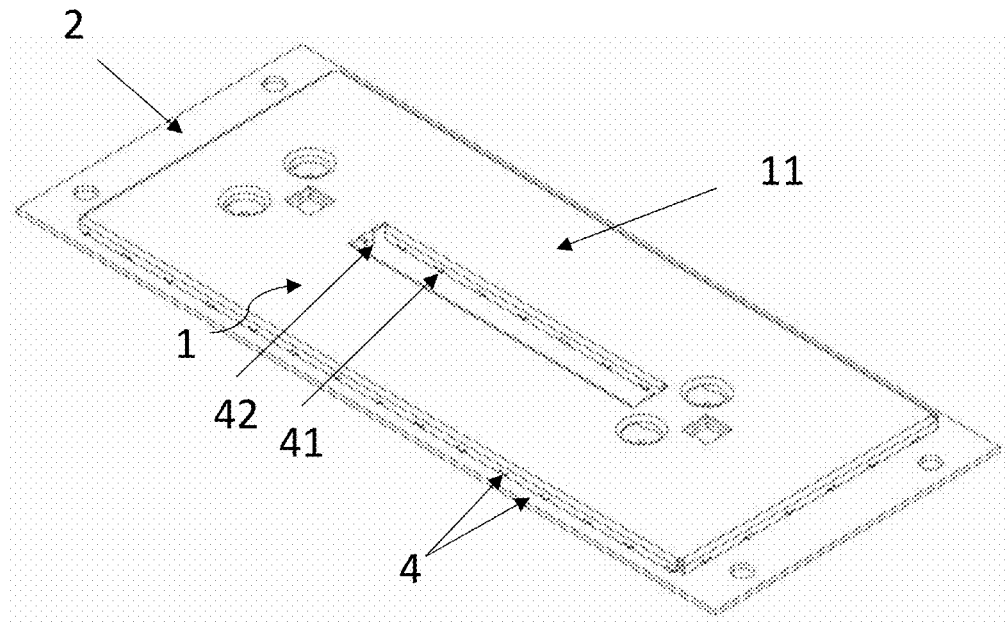
FIG. 1 shows a representation of a shield housing according to an embodiment of the present invention.

FIG. 1 shows a shield housing 1 according to an embodiment of the present invention. The shield housing 1 can be disposed on a circuit board 2 in such a manner that it covers the open conductor structure that is present on the circuit board 2, as well as additional components completely, i.e. at least in part. The electrical connection between the shield housing and the ground surface of the circuit board 2 that is required for shielding is implemented, for example, by way of connectors or pins 4 on the shield housing 1. The pins 4 project through the circuit board 2 and are electrically connected with, for example soldered to the ground surface of the circuit board 2 on its underside. The top of the shield housing 1 is referred to as a lid or shield lid 11. Components such as the antenna radiator 3 are disposed on the lid 11.

The pins 4 are disposed at a distance that is suitable for achieving a sufficient shielding effect in the desired frequency range. For a frequency range from 0.5 GHz to 4.0 GHz, the pin distances preferably lie between 5 mm and 15 mm. For higher frequencies, the pin distance can be reduced even further, in order to achieve a suitable shield effect.

In FIG. 1, a preferred embodiment of the shield housing 1 is shown, namely as a shield housing 1 configured in one piece. For decoupling of two antenna radiators 3 that can be disposed on it, the shield lid 11 is separated and folded over a major portion of its length in the central region between the antenna radiators 3. Additional pins 41 on these folded areas can now also be connected with the ground surface on the underside of the circuit board 2. A sufficiently good electrical insulation effect of the feeds for two different polarizations, for example, can be achieved by means of this extensive separation of the two shield lid regions. Further additional pins 42 at the folded face sides of the shield lid 11 increase the desired insulation effect even further.

Alternatively or in addition to the solution that the shield housing 1 configured in one piece comprises a folded region, a similar effect can be achieved by means of an additional component disposed on the shield housing 1, for example in the form of a partition wall in the shield lid 11. This additional component can be electrically connected or galvanically coupled with the shield lid 11. The connection with the ground surface of the circuit board 2 can also, as described above, take place by way of pins or in another manner, for example capacitively or galvanically.

Figure 2:
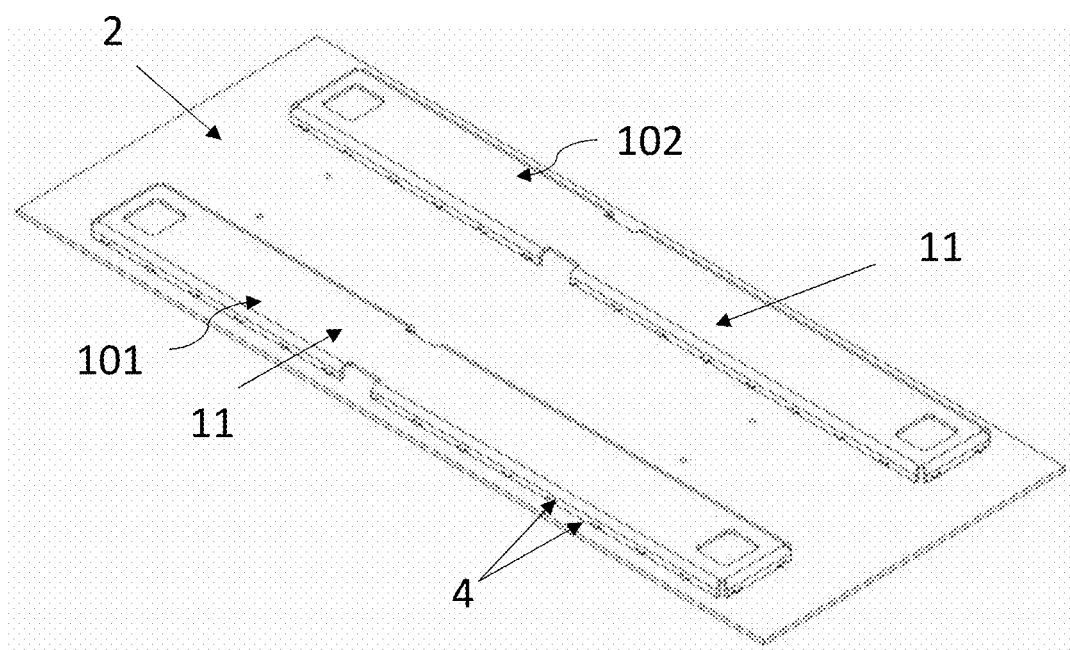
FIG. 2 shows a representation of a shield housing according to a further embodiment of the present invention.

In FIG. 2, a shield housing 1 is shown, which consists of two parts. In both cases, the expansions and components described above and below can be used for both types of shield housings 1. Slight modifications, in order to obtain an adaptation to a one-piece shield housing 1 or a shield housing 1 composed of two parts, are obvious to a person skilled in the art, in and of themselves or from the following description.

In the case of a shield housing 1 configured of two parts, as shown in FIG. 2, the two parts 101 and 102 of the shield housing 1 are disposed at a distance from one another on the circuit board 2, preferably with their long sides parallel to one another or next to one another, in such a manner that the required shielding effect is provided. In this regard, the parts 101 and 102 of the shield housing 1 can be configured in such a manner that a part of each antenna radiator 3 is disposed on a part 101 or 102 of the shield housing 1, in each instance, or on the corresponding lid 11, or the entire antenna radiator 3 is disposed on only one part 101 or 102 of the shield housing 1 or the corresponding lid 11. The parts 101 and 102 of the shield housing 1 consisting of two parts can be formed in the most different ways, as long as they almost completely cover the open structures of the circuit board 2, the antenna radiators 3 can be disposed on them, and the desired shield effect is achieved.

As described for FIG. 1, the two parts 101 and 102 of the shield housing 1 can have pins 4 and/or 41 on one or more outer sides or circumferential sides, by means of which the insulation effect is clearly increased. Also, one part 101 or 102 or both parts 101 and 102 of the shield housing 1 can have a partition wall disposed on the respective part 101 or 102 instead of the pins 4.

Figure 3:
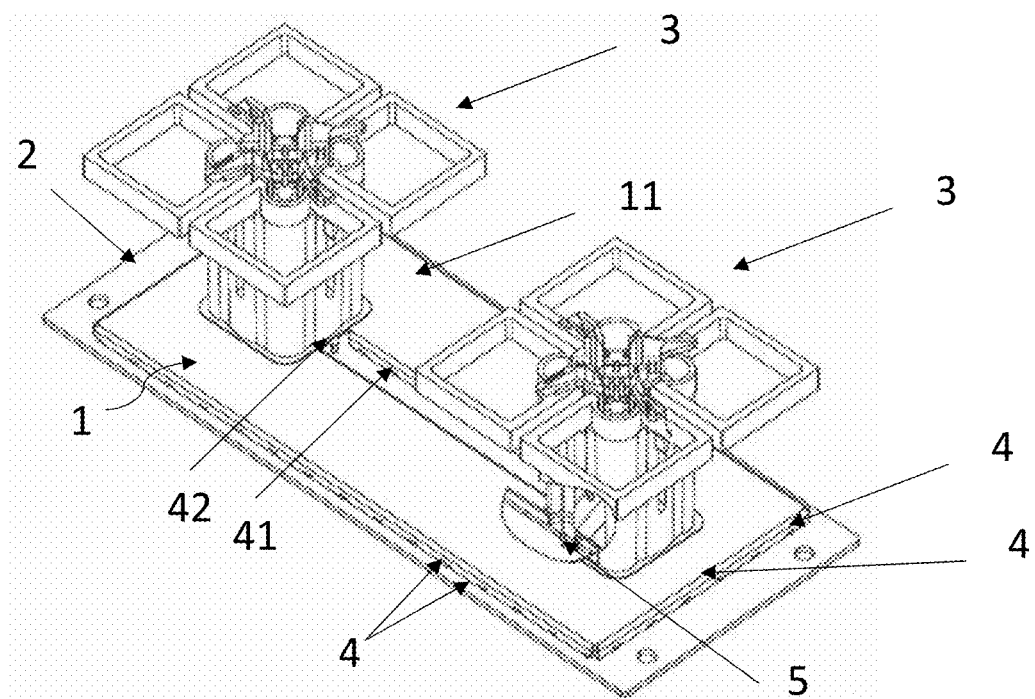
FIG. 3 shows a representation of a shield housing according to a further embodiment of the present invention.

FIG. 3, as an example, shows a shield housing 1 disposed on a circuit board 2, having two antenna radiators 3 disposed on it, in this case two vector radiators, according to an embodiment of the present invention. The shield housing 1 is configured in one piece and has pins 4, 41, 42 both on its outer sides and on the folded areas and the face side of the folded region. In addition, a further characteristic of a further embodiment of the invention for improving the shielding properties is shown enlarged in FIG. 4, namely that the shield housing 1 has a deep-drawn region on which an electrical contact 3 with the ground surface of the circuit board 2 can be produced by way of a pin.

The antenna radiators 3 disposed on the shield lid of the shield housing 1 are represented as vector radiators here, but can also be other suitable radiators, such as, for example, turnstile antennas on a sheet-metal or circuit-board basis, patch radiators, etc., which are disposed on the circuit board 2.

For a clear reduction in the mass or of the weight of the entire antenna or module, plastic radiators having a conductive surface produced by means of metallization, for example, can be used.

The ground surface of the antenna radiator 3 is coupled with the shield lid 11 capacitively, for example, by way of an insulator such as a varnish, a plastic film or other non-conductive surfaces on the dipole and/or the shield lid 11. Aside from capacitive coupling of the radiators 3 with the shield housing 1, a galvanic connection by means of a screw connection, soldering, pressing in, and other known methods is also possible.

Alternatively to the use of pins 4 for producing the optimal electrical connection between the shield housing 1 and the ground surface of the circuit board, other types of connections can also be used. For example, through-contacts or vias can be disposed on the circuit board 2, or suitable capacitive couplings can be provided.

Not only can open electrical conductor structures on the circuit board be covered by means of the shield housing 1, but rather additional structures or components can also be covered, such as, for example, filters using micro-strip technology, or phase shifter components. If, for example, a filter structure is situated below the shield housing 1, tuning elements for tuning the filter properties can be directly set into the shield housing 1.

To optimize the shielding effect, it can be provided that a connection of coaxial signal lines on the ground side of the circuit board takes place in such a manner that not only the outer conductor but also the inner conductor of the antenna radiators 3 can be soldered only from one side. Because of this embodiment, no openings are required in the shield lid 11 of the shield housing 1. This means that the ground is drawn by means of through-contacting to the ground surface of the circuit board to the top of the circuit board, and the shield housing and/or one or more of the at least one lid directly contacts the ground at the top.

By means of the structure of the shield housing 1, it is possible to implement a very flat shield housing having a height of only 3 mm—without pins—wherein in this way, the diagram properties of the antenna radiator 3 are not influenced, or only influenced slightly, i.e. within an acceptable scope.

Figure 4:
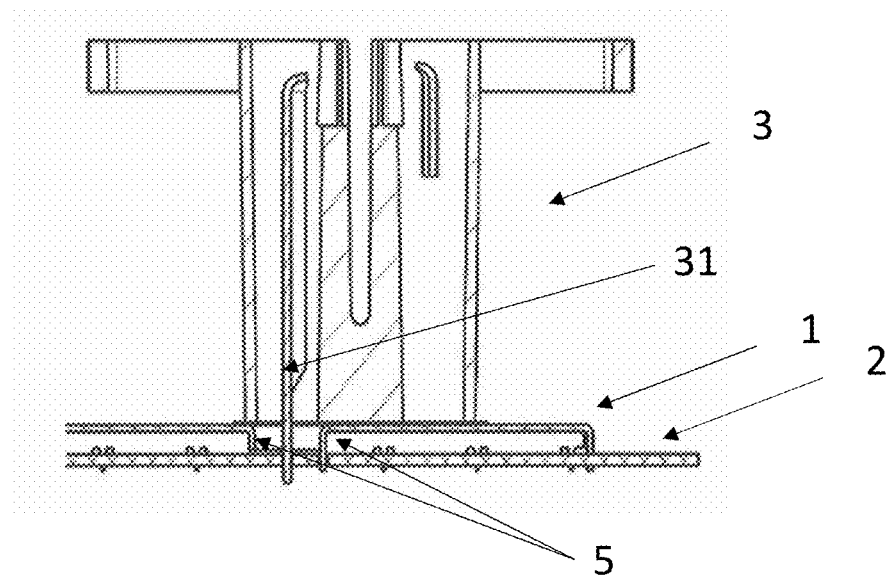
FIG. 4 shows an enlargement of an additional characteristic on the shield housing according to a further embodiment of the present invention.

FIG. 4 shows an enlarged representation of the further characteristic shown in FIG. 3 of a further embodiment of the invention to improve the shielding properties. The decisive factor for an electrically well implemented connection of the antenna radiators 3 disposed on the shield lids 11 with the circuit board 2 is to allow an electrical connection of the signal-carrying structures, which are implemented with the least possible spatial expanse. Such an arrangement is shown in FIG. 4. The inner conductor 31 of the antenna radiator 3 is lengthened in such a manner that a direct connection with the circuit board 2 takes place, for example by way of a soldered connection. The ground connection is achieved in that a structure 5 that is deep-drawn above the shield lid 11, on which structure one or more pins 43 is/are affixed, is provided.

As for the pins described above, a connection with the ground surface by means of soldering is also possible for the pins 43 of the deep-drawn structure. The pins 43, like the pins 4, 41, and 42, can project through the circuit board 2 at holes in the circuit board 2 provided for this purpose, to the underside of the circuit board 2.

If the deep-drawn structure 5 is implemented to be round, it essentially forms an extension of the coaxial system of the antenna radiator 3.

Alternatively to the deep-drawn structure 5 present in the lid, this structure can also be provided as part of the antenna radiator 3. Here, corresponding pins or other suitable structures for galvanic or capacitive contacting with the ground surface of the circuit board 2 must then be provided. Furthermore, a sufficiently large hole has to be provided in the circuit board 2, so that the structure can be passed through the circuit board 2 on the antenna radiator 3.

An alternative to the deep-drawn structure in the shield lid or the antenna radiator is to couple an adapter component or additional component capacitively or galvanically with the shield housing 1 or the antenna radiator 3, as a connection element. The connection with the ground surface of the circuit board 2 then also takes place by way of pins or other suitable structures, as described above.

By means of these embodiments, good electrical values can be achieved, for example for adaptation of the antenna radiators and thereby of the entire module. Furthermore, very good decoupling of the polarization can be achieved by means of the direct connection of the extended coaxial systems with the ground of the circuit board.

Figure 5:
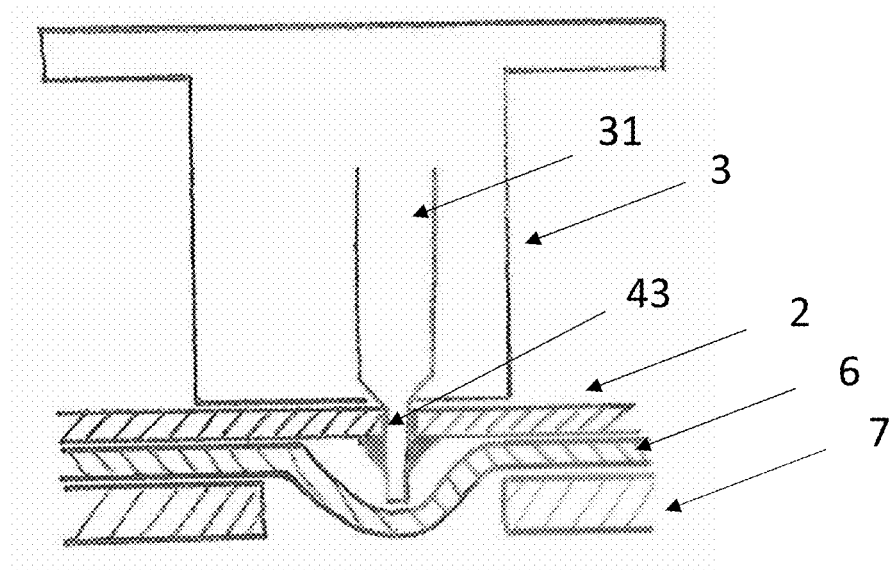
FIG. 5 shows a representation of a system according to an embodiment of the present invention.
Figure 6:
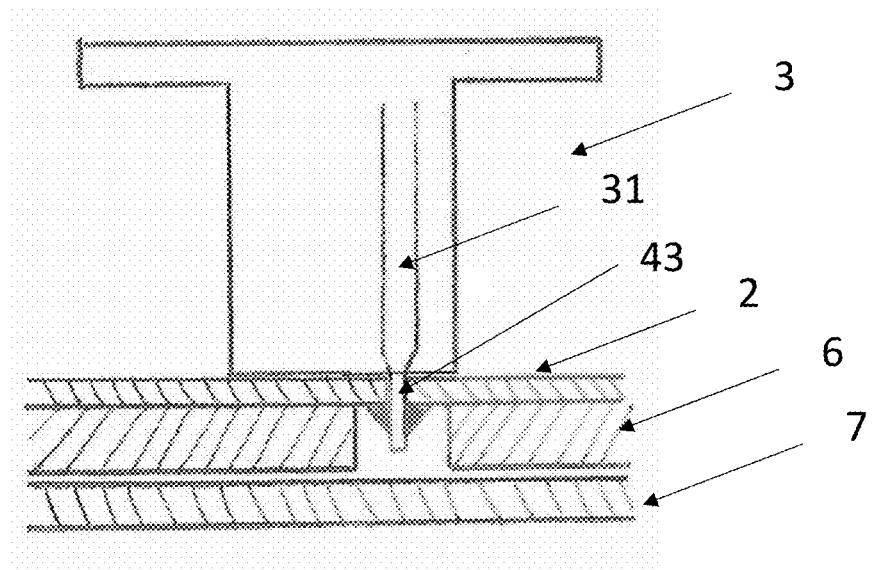
FIG. 6 shows a representation of a system according to a further embodiment of the present invention.

Further optimization of the shielding can take place in that the pins 4, 41, 42, 43 that project through the circuit board 2 are shielded on the back of the circuit board 2 by means of an adapter plate 6, from the reflector 7 disposed underneath the circuit board 2, as shown in FIGS. 5 and 6.

FIG. 5 shows an embodiment as to how pins 4, 41, 42, 43 that project through the circuit board 2 are shielded on the back of the circuit board 2 by means of an adapter plate 6. In this regard, the adapter plate 6 is disposed above the underside of the circuit board 2 in such a manner that it has an outward bulge at locations where pins 4, 41, 42, 43 project through the circuit board. The reflector 7, which is disposed below the adapter plate 6, has a recess or opening at these locations, so that the outward bulge of the adapter plate 6 has sufficient room. The properties of the reflector are not impaired by this solution, and undesirable interference caused by the pins 4, 41, 42, 43 is prevented.

An alternative to the solution mentioned above is shown in FIG. 6. Here, an adapter plate 6 is also provided between the circuit board 2 and the reflector 7. However, in this embodiment the adapter plate 6 is configured in such a manner that it has a thickness that corresponds at least to the length of the pin 4, 41, 42, 43 that projects farthest through the circuit board. Because of this thickness requirement, the reflector 7 can be formed over the entire underside of the circuit board, i.e. no holes need to be drilled into the sheet metal of the reflector 7, so that no disruptive influences act on the reflector.

The adapter plate 6 in both embodiments can be electrically insulated by means of sufficiently thin films and/or varnish and/or suitable coatings, so that capacitive coupling between the ground surface of the circuit board 2 and the reflector 7 can be made possible.

The present invention, with its modifications, provides a completely shielded connection of antenna radiators to a circuit board and a sheet-metal reflector, thereby making it possible to avoid undesirable interactions between feed and antenna radiators and the other surroundings. In this way, disruptive influences on the antenna parameters can be avoided.

Furthermore, additional functions or modules such as filters or phase shifters can be integrated without negative interactions with the antenna radiators or the other surroundings below the shield housing. Also, further functions, which were previously disposed on the back of the reflector, can be provided on the top of the circuit board, under the shield housing. Additionally, further functions such as tuning elements for filters can be integrated into the shield lid.

Because of the embodiment of the shield housing, capacitively coupled antenna radiators can be used, so that no galvanic connection such as screw contacts or solder connections and no holes in the shield housing are required any longer. Also, because of capacitative coupling, the use of plastic radiators having a conductive surface is possible, so that in this way, the total weight of the module can be reduced.

REFERENCE SYMBOL LIST 1 shield housing
11 lid
101, 102 parts of the shield housing
2 circuit board
3 antenna radiator
31 inner conductor
4, 41, 42, 43 pins
5 deep-drawn structure
6 adapter plate
7 reflector

What is claimed is:

1. A shield housing for shielding interconnect structures and/or components disposed on a circuit board, wherein at least two antenna radiators are disposed on the shield housing, wherein the shield housing, is configured in such a manner cover the interconnect structures and/or components disposed on the circuit board, at least in part, to be connected with a ground surface of the circuit board, and wherein the shield housing has a region between the antenna radiators, which is configured in such a manner to provide electrical decoupling of a feed of the antenna radiators from one another wherein the region between the antenna radiators is a region in the center of the shield housing, which region is configured as an opening having folded areas around the opening in the shield housing.

2. The shield housing according to claim 1, wherein the shield housing is configured in one piece.

3. The shield housing according to claim 1, wherein the shield housing is configured in such a manner to completely cover the interconnect structures and/or components disposed on the circuit board.

4. The shield housing according to claim 1, wherein a ground is drawn to the ground surface of the circuit board on the top of the circuit board by means of through-contacting, and the shield housing is contacted with the ground directly on the top.

5. The shield housing according to claim 1, wherein pins, which are disposed at a predetermined pin distance from one another, are disposed at the folded areas for contacting the circuit board.

6. The shield housing according to claim 1, wherein the region between the feeds of the antenna radiators is configured as a partition wall connected with the shield housing.

7. The shield housing according to claim 6, wherein the partition wall is electrically connected or coupled with the shield housing, capacitively or galvanically.

8. The shield housing according to claim 1, wherein the shield housing has pins for contacting the ground surface of the circuit board on Ps—the outer edge of the circuit board, which pins are disposed at a predetermined distance from one another.

9. The shield housing according to claim 5, wherein the predetermined distance of the protrusions amounts to between 5 mm to 15 mm, inclusive.

* * * * *